(12) United States Patent
Lin et al.

(10) Patent No.: US 11,160,183 B2
(45) Date of Patent: Oct. 26, 2021

(54) FIXING ASSEMBLY AND FUNCTIONAL MODULE HAVING FIXING ASSEMBLY

(71) Applicant: HONGFUJIN PRECISION ELECTRONICS(TIANJIN)CO., LTD., Tianjin (CN)

(72) Inventors: Jia-Feng Lin, New Taipei (TW); Chieh-Hsiang Lin, New Taipei (TW)

(73) Assignee: HONGFUJIN PRECISION ELECTRONICS (TIANJIN) CO., LTD., Tianjin (CN)

( * ) Notice: Subject to any disclaimer, the term of this patent is extended or adjusted under 35 U.S.C. 154(b) by 27 days.

(21) Appl. No.: 16/787,336

(22) Filed: Feb. 11, 2020

(65) Prior Publication Data

US 2021/0176881 A1     Jun. 10, 2021

(30) Foreign Application Priority Data

Dec. 5, 2019   (CN) .......................... 201911234543.9

(51) Int. Cl.
*H05K 7/14*     (2006.01)
*H05K 5/02*     (2006.01)

(52) U.S. Cl.
CPC ........... *H05K 7/1401* (2013.01); *H05K 5/023* (2013.01); *H05K 5/0221* (2013.01)

(58) Field of Classification Search
CPC ..... H05K 7/1401; H05K 5/0221; H05K 5/023
See application file for complete search history.

(56) References Cited

U.S. PATENT DOCUMENTS

| 10,534,411 | B2* | 1/2020 | Spencer | G06F 1/187 |
| 10,765,028 | B1* | 9/2020 | Beall | A47B 88/919 |
| 10,932,383 | B2* | 2/2021 | Ehlen | H05K 5/0239 |
| 2021/0037671 | A1* | 2/2021 | Ye | H05K 7/1415 |

FOREIGN PATENT DOCUMENTS

TW         M579869 U     6/2019

* cited by examiner

*Primary Examiner* — James Wu
*Assistant Examiner* — Hung Q Dang
(74) *Attorney, Agent, or Firm* — ScienBiziP, P.C.

(57) ABSTRACT

A functional module includes an electronic component and a fixing assembly. The fixing assembly includes a base, a handle slidably mounted on the base, a rotating shaft mounted on the base, and a latching hook rotationally mounted on the base by the rotating shaft. The electronic component is mounted on the base. The latching hook includes a latching portion protruding out of the base. The handle includes a lifting portion inclined relative to the base and configured to resist against an end of the latching hook opposite the rotating shaft. When the handle is pulled out, the latching hook is driven by the lifting portion to rotate about the rotating shaft, and the latching portion is retracted within the base.

12 Claims, 6 Drawing Sheets

FIXING ASSEMBLY AND FUNCTIONAL MODULE HAVING FIXING ASSEMBLY

FIELD

The subject matter herein generally relates to functional modules, and more particularly to a functional module including a fixing assembly.

BACKGROUND

Referring to FIG. 1 and FIG. 2, in the existing functional module, an elastic sheet 1 and a housing 2 are latched together. The elastic sheet 1 protrudes out of the housing 2. When the functional module needs to be pulled out of an electronic device, the elastic sheet 1 needs to be moved sideways before being pulled. In order to save space in the electronic device, a plurality of functional modules are densely arranged in a chassis 10 of the electronic device. However, a distance h for moving to the side is insufficient, which makes it inconvenient to take out the functional modules.

BRIEF DESCRIPTION OF THE DRAWINGS

Implementations of the present disclosure will now be described, by way of embodiments, with reference to the attached figures.

DETAILED DESCRIPTION

Figure 1:
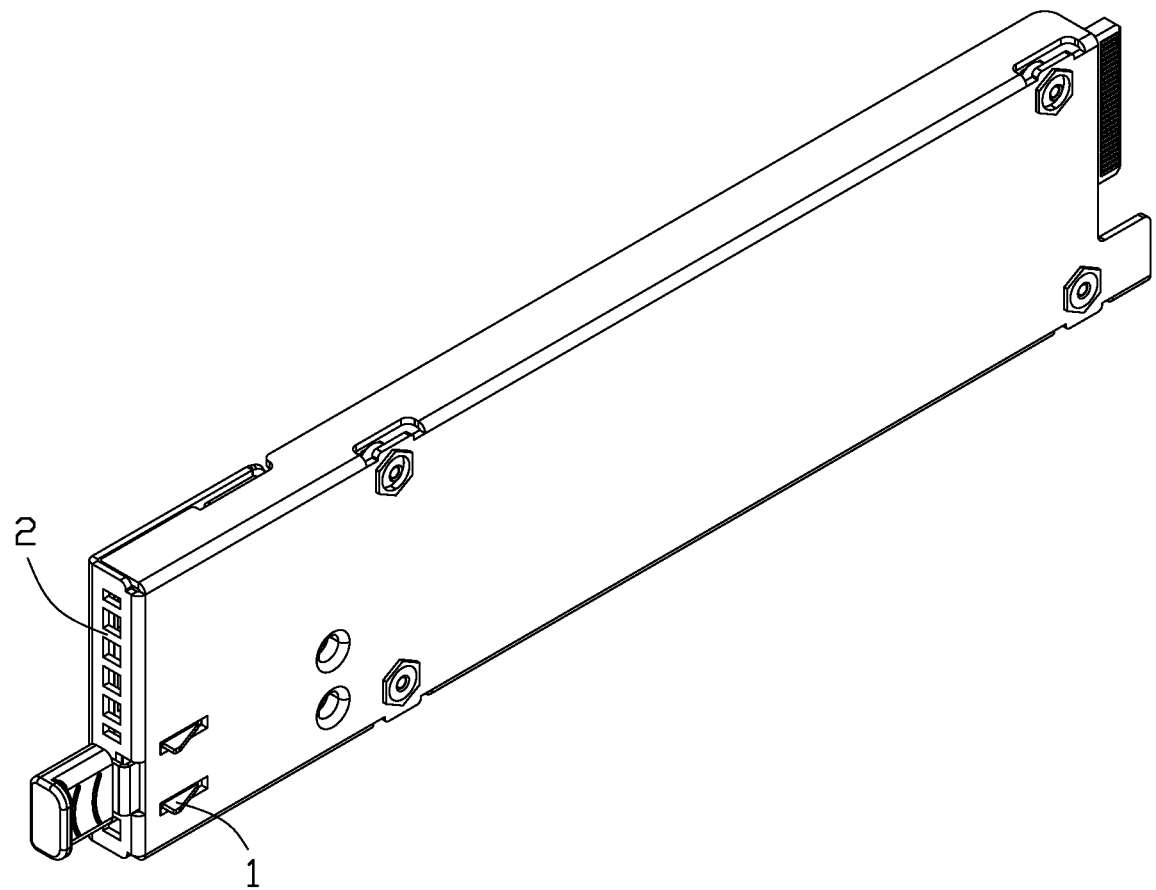
FIG. 1 is an assembled, isometric view of a functional module in the related art.
Figure 2:
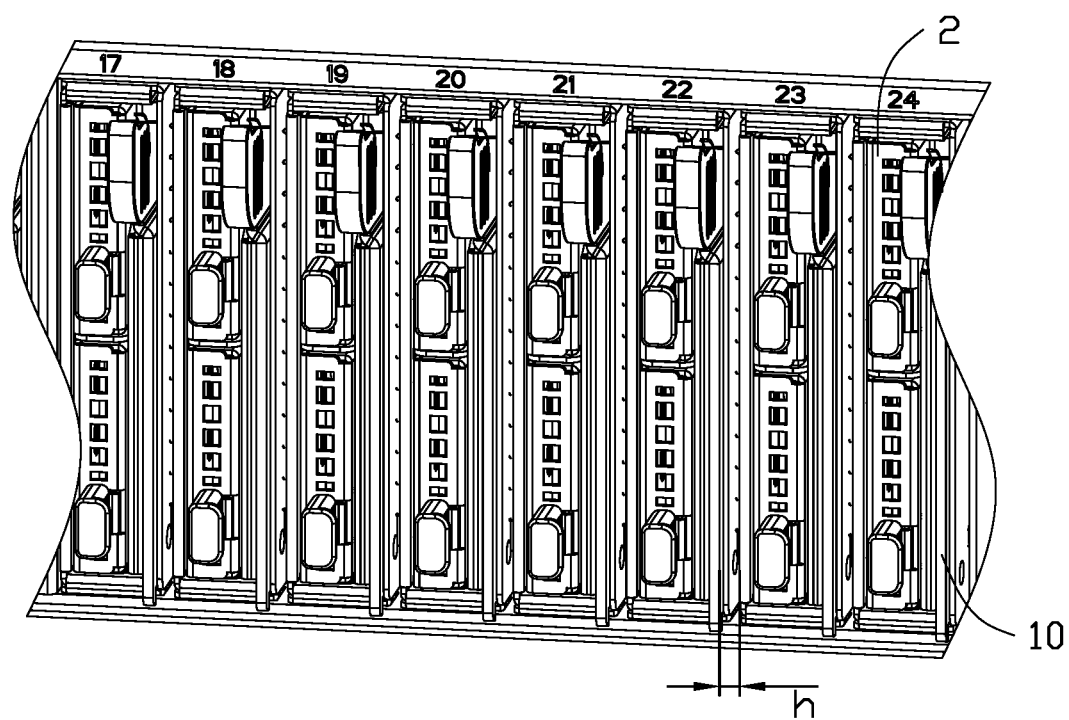
FIG. 2 is a side view of a plurality of functional modules installed in a chassis in the related art.

It will be appreciated that for simplicity and clarity of illustration, where appropriate, reference numerals have been repeated among the different figures to indicate corresponding or analogous elements. Additionally, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. The drawings are not necessarily to scale and the proportions of certain parts may be exaggerated to better illustrate details and features. The description is not to be considered as limiting the scope of the embodiments described herein.

Several definitions that apply throughout this disclosure will now be presented.

The term "coupled" is defined as connected, whether directly or indirectly through intervening components, and is not necessarily limited to physical connections. The connection can be such that the objects are permanently connected or releasably connected. The term "comprising" means "including, but not necessarily limited to"; it specifically indicates open-ended inclusion or membership in a so-described combination, group, series and the like.

Figure 3:
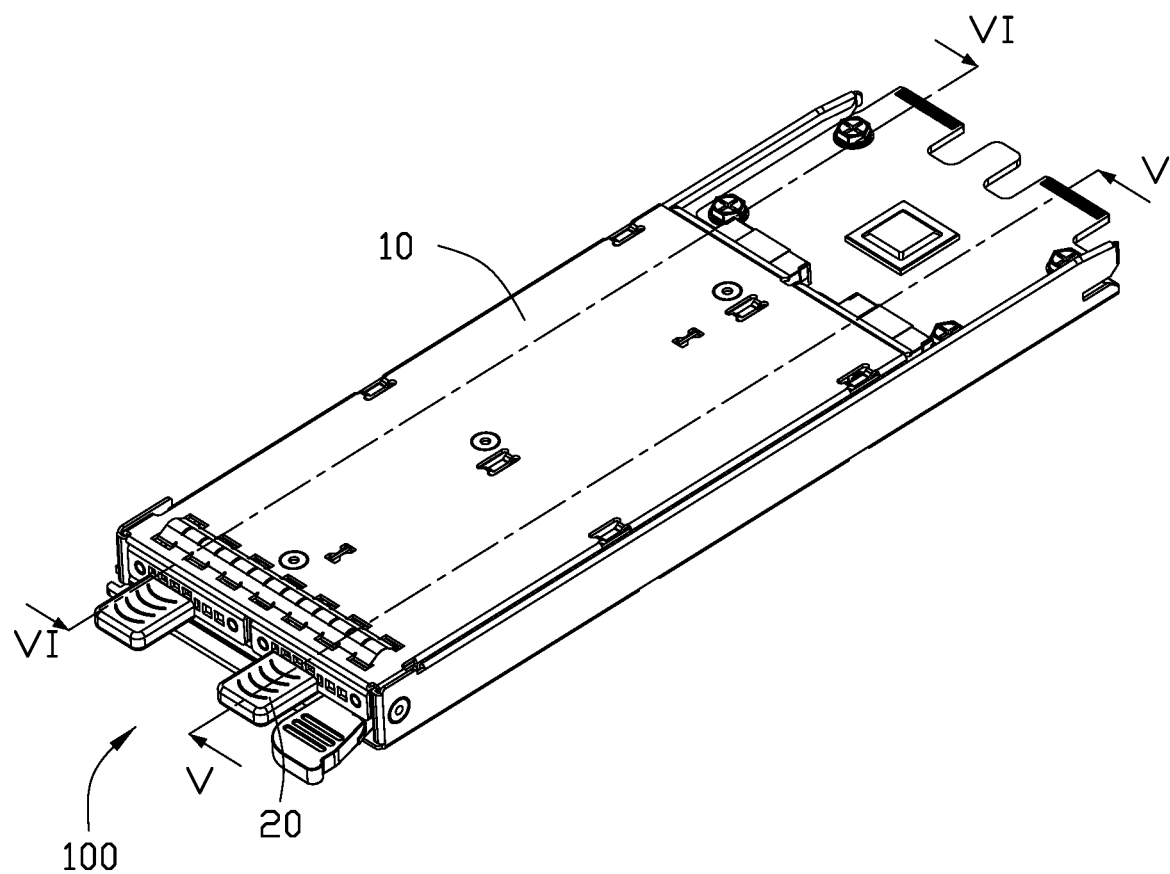
FIG. 3 is an assembled, isometric view of an embodiment of a functional module.
Figure 4:
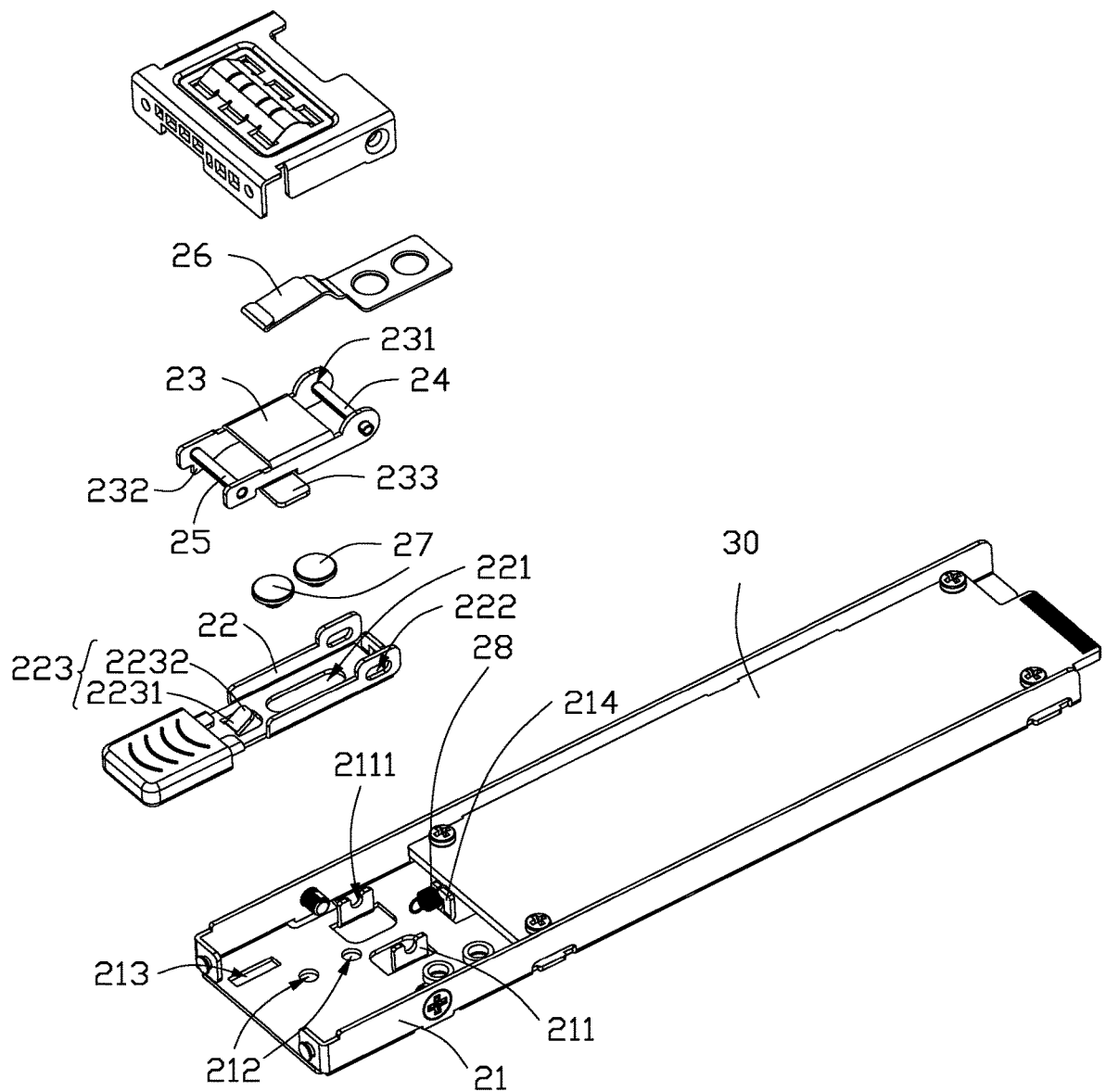
FIG. 4 is an exploded view of the functional module in FIG. 3.

FIGS. 3-4 show an embodiment of a functional module 100 that can be assembled into a chassis 10 of an electronic device. The functional module 100 includes a fixing assembly 20 and an electronic component 30. The electronic component 30 may be, but is not limited to, a CPU, a chipset, a memory, or a magnetic disk. The fixing assembly 20 is partially received in the chassis 10 and partially protrudes outside the chassis 10. The fixing assembly 20 is connected to the electronic component 30. The fixing assembly 20 can be conveniently pulled out of the chassis 10.

Figure 5:
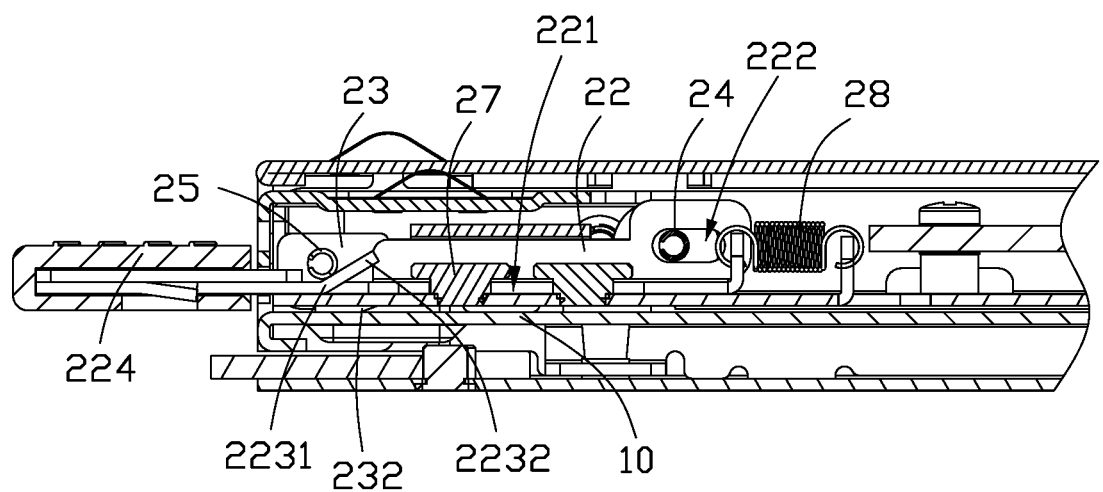
FIG. 5 is a cross-sectional view taken along line V-V in FIG. 3.
Figure 6:
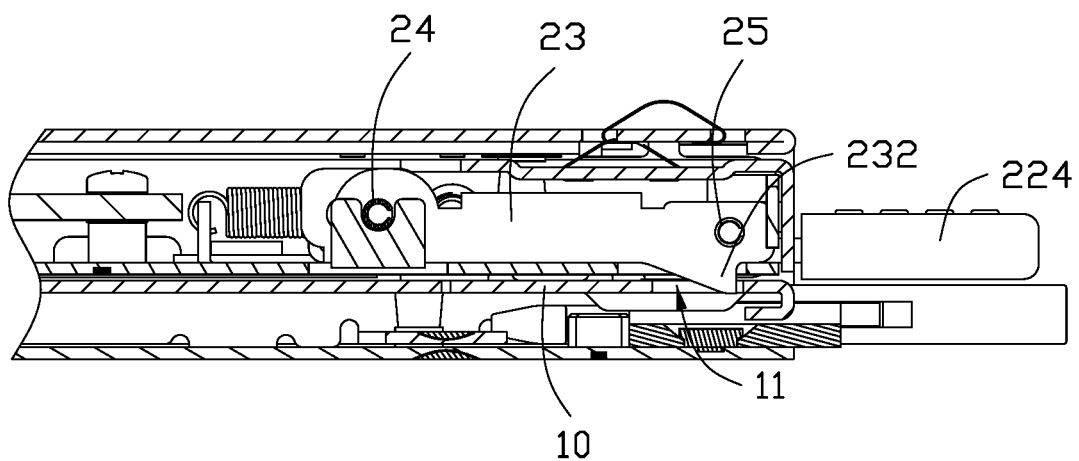
FIG. 6 is a cross-sectional view taken along line VI-VI in FIG. 3.

Referring to FIG. 4 to FIG. 6, the fixing assembly 20 includes a base 21, a handle 22, a latching hook 23, a rotating shaft 24, a resisting shaft 25, and a flap 26. The base 21 is received in the chassis 10. The electronic component 30 is located on the base 21.

The handle 22 is slidably mounted on the base 21. The rotating shaft 24 is mounted on the base 21 and is located on one end of the latching hook 23. The latching hook 23 is rotationally mounted on the base 21 by the rotating shaft 24 and partially protrudes from the base 21 to be fixed on the chassis 10. The resisting shaft 25 is located on an end of the latching hook 23 opposite the rotating shaft 24 and resists the handle 22. One end of the flap 26 is fixed on the base 21, and another end of the flap 26 presses the latching hook 23. When the handle 22 slides outward, the handle 22 resists against the latching hook 23 to rotate about the rotating shaft 24, so that the latching hook 23 is released from the chassis 10.

The base 21 includes two support portions 211, and each support portion 211 is recessed to define a positioning groove 2111. Opposite ends of the rotating shaft 24 are respectively received in the positioning grooves 2111.

The fixing assembly 20 further includes two limiting members 27. Two positioning holes 212 are formed in the base 21. The handle 22 defines a slot 221. The two limiting members 27 partially pass through the slot 221 and are respectively locked in the two positioning holes 212. The handle 22 slides in a direction from one limiting member 27 to the other limiting member 27. A maximum sliding distance of the handle 22 is from a position where an inner wall of the slot 221 abuts one limiting member 27 to a position where the inner wall of the slot 221 abuts the other limiting member 27.

One end of the latching hook 23 adjacent to the support portion 211 defines two rotation holes 231. The rotating shaft 24 passes through the two rotation holes 231. A latching portion 232 protrudes from an end of the latching hook 23 adjacent to the resisting shaft 25. The base 21 defines a clearance hole 213 corresponding to the latching portion 232. The latching hook 23 is configured to rotate about the rotating shaft 24, so that the latching portion 232 passes through the clearance hole 213 to latch onto the fixed shell 10. The latching hook 23 rotates about the rotating shaft 24 to remove the latching portion 232 from the clearance hole 213 to disengage from the chassis 10.

The handle 22 is provided with a lifting portion 223 corresponding to the resisting shaft 25. The lifting portion 223 is inclined relative to the base 21. The lifting portion 223 includes a first end 2231 coupled to the base 21 and a second end 2232 which is a free end. When the handle 22 slides out, the resisting shaft 25 moves from the first end 2231 to the second end 2232 of the lifting portion 223, thereby driving the latching hook 23 to rotate about the rotating shaft 24.

In one embodiment, the resisting shaft 25 may be integrally formed with the latching hook 23.

Two sliding holes 222 are defined in one end of the handle 22 adjacent to the rotating shaft 24. The sliding holes 222 are elongated. The rotating shaft 24 passes through the two sliding holes 222 to be positioned on the base 21. In other embodiments, each support portion 211 may define a positioning hole for positioning the rotation shaft 24, so that the sliding holes 222 are omitted.

An end of the handle 22 opposite the rotating shaft 24 protrudes from the base 21. In one embodiment, the end of the handle 22 protruding from the base 21 includes a holding portion 224, so that pulling the handle 22 is made more convenient.

The flap 26 is located on one side of the latching hook 23. An extending portion 233 extends from the latching hook 23 toward the flap 26. One end of the flap 26 is fixed on the base 21, and another end of the flap 26 presses the extension portion 233. When the latching hook 23 is rotated away from the base 21 about the rotating shaft 24, the flap 26 is elastically deformed. When the handle 22 is let go from being pulled out of the chassis 10, the flap 26 elastically restores to drive the latching hook 23 to rotate toward the base 21 about the rotating shaft 24. In other embodiments, an elastic member such as a torsion spring may be provided between the latching hook 23 and the base 21 to provide a restoring force to drive the latching hook 23 to rotate back toward the base 21.

A fixing portion 214 is provided on the base 21 adjacent to the handle 22. The fixing assembly 20 further includes a resilient member 28 located between the handle 22 and the fixing portion 214. One end of the resilient member 28 is connected to the handle 22, and another end of the resilient member 28 is connected to the fixing portion 214. When the handle 22 is pulled out of the chassis 10, the resilient member 28 is elastically deformed. When the handle 22 is let go, the resilient member 28 resiliently restores to retract the handle 22.

In one embodiment, the chassis 10 is applied in an electronic device, and the chassis 10 includes at least one of the above-described functional modules 100. The functional module 100 is assembled into the chassis 10 and is locked with the chassis 10. Specifically, the fixed shell 10 defines a latching hole 11 corresponding to the latching portion 232. When the latching hook 23 is rotated about the rotating shaft 24, the latching portion 232 is locked or detached from a side wall of the latching hole 11. The electronic device may be, but is not limited to, a server or a personal computer terminal.

When in use, the fixing assembly 20 can be pulled out only by pulling the handle 22, and the fixing assembly 20 is automatically retracted into the chassis 10 when the handle 22 is released. Thus, the handle 22 does not need to be moved sideways, so that a plurality of functional modules 100 can be closely arranged in the electronic device, which is beneficial to saving space of the electronic device and improves a user experience.

The embodiments shown and described above are only examples. Even though numerous characteristics and advantages of the present technology have been set forth in the foregoing description, together with details of the structure and function of the present disclosure, the disclosure is illustrative only, and changes may be made in the detail, including in matters of shape, size and arrangement of the parts within the principles of the present disclosure up to, and including, the full extent established by the broad general meaning of the terms used in the claims.

What is claimed is:

1. A fixing assembly comprising:
a base;
a handle slidably mounted on the base;
a rotating shaft mounted on the base; and
a latching hook rotationally mounted on the base by the rotating shaft; wherein:
the latching hook comprises a latching portion protruding out of the base;
the handle comprises a lifting portion inclined relative to the base and configured to resist against an end of the latching hook opposite the rotating shaft;
when the handle is pulled out, the latching hook is driven by the lifting portion to rotate about the rotating shaft, and the latching portion is retracted within the base.

2. The fixing assembly of claim 1, further comprising a flap located on a side of the latching hook, wherein:
the latching hook comprises an extending portion extending toward the flap; and
one end of the flap is fixed to the base, and another end of the flap presses against the extending portion.

3. The fixing assembly of claim 2, wherein:
one end of the lifting portion is coupled to the base, and another end of the lifting portion is a free end.

4. The fixing assembly of claim 2, wherein:
the base comprises a fixing portion;
the fixing assembly further comprises a resilient member located between the handle and the fixing portion;
one end of the resilient member is coupled to the handle, and another end of the resilient member is coupled to the fixing portion;
when the handle is pulled out of the chassis, the resilient member is elastically deformed;
when the handle is released, the resilient member resiliently restores to retract the handle.

5. The fixing assembly of claim 4, wherein:
the fixing assembly further comprises two limiting members;
two positioning holes are defined in the base;
the handle defines a slot; and
the two limiting members partially pass through the slot and are respectively locked in the two positioning holes.

6. A functional module comprising:
an electronic component; and
a fixing assembly comprising:
a base;
a handle slidably mounted on the base;
a rotating shaft mounted on the base; and
a latching hook rotationally mounted on the base by the rotating shaft;
wherein:
the electronic component is mounted on the base;
the latching hook comprises a latching portion protruding out of the base;
the handle comprises a lifting portion inclined relative to the base and configured to resist against an end of the latching hook opposite the rotating shaft;
when the handle is pulled out, the latching hook is driven by the lifting portion to rotate about the rotating shaft, and the latching portion is retracted within the base.

7. The functional module of claim 6, wherein:
the fixing assembly further comprises a flap located on a side of the latching hook;
the latching hook comprises an extending portion extending toward the flap; and one end of the flap is fixed to the base, and another end of the flap presses against the extending portion.

8. The functional module of claim 6, wherein:

the base comprises a fixing portion;

the fixing assembly further comprises a resilient member located between the handle and the fixing portion;

one end of the resilient member is coupled to the handle, and another end of the resilient member is coupled to the fixing portion;

when the handle is pulled out of the chassis, the resilient member is elastically deformed;

when the handle is released, the resilient member resiliently restores to retract the handle.

9. The functional module of claim 6, wherein:

the fixing assembly further comprises two limiting members;

two positioning holes are defined in the base;

the handle defines a slot; and the two limiting members partially pass through the slot and are respectively locked in the two positioning holes.

10. The functional module of claim 9, wherein:

the handle is configured to slide in a direction from one limiting member to the other limiting member; and a maximum sliding distance of the handle is from a position where an inner wall of the slot abuts one limiting member to a position where the inner wall of the slot abuts the other limiting member.

11. The functional module of claim 10, wherein:

two sliding holes are defined in one end of the handle adjacent to the rotating shaft; and the rotating shaft passes through the two sliding holes to be positioned on the base.

12. The functional module of claim 6, wherein:

an end of the handle opposite the rotating shaft protrudes out of the base and comprises a holding portion.

\* \* \* \* \*